United States Patent [19]

Keith et al.

[11] Patent Number: 5,077,540

[45] Date of Patent: Dec. 31, 1991

[54] MINIMUM PULSE WIDTH SWITCHING POWER AMPLIFIER

[75] Inventors: F. Joseph Keith, Charlottesville; Eric H. Maslen, Earlysville, both of Va.

[73] Assignee: University of Virginia Patents Foundation, Charlottesville, Va.

[21] Appl. No.: 537,808

[22] Filed: Jun. 14, 1990

[51] Int. Cl.$^5$ .............................................. H03F 3/217
[52] U.S. Cl. ...................................... 330/251; 330/10; 330/207 A; 330/9
[58] Field of Search ................... 330/251, 10, 207 A, 330/9, 252

[56] References Cited

U.S. PATENT DOCUMENTS

| | | | |
|---|---|---|---|
| 3,560,829 | 2/1971 | Brennan | 315/314 |
| 3,745,477 | 7/1973 | Freeborn | 330/110 |
| 4,272,713 | 6/1981 | Pritchard | 330/8 |
| 4,288,738 | 9/1981 | Rogers et al. | 323/271 |
| 4,326,170 | 4/1982 | Levy | 330/251 |
| 4,471,278 | 9/1984 | Matouka | 318/561 |
| 4,500,844 | 2/1985 | Lisco | 330/10 |
| 4,509,101 | 4/1985 | Kenji | 330/10 |
| 4,517,522 | 5/1985 | Furrer | 330/10 |
| 4,531,096 | 7/1985 | Yokoyama | 330/251 |
| 4,636,711 | 1/1987 | Freymuth | 323/282 |
| 4,649,467 | 3/1987 | Vesce | 330/207 A |
| 4,779,183 | 10/1988 | Mutoh et al. | 363/41 |

Primary Examiner—Eugene R. LaRoche
Assistant Examiner—Tan Dinh
Attorney, Agent, or Firm—Oblon, Spivak, McClelland, Maier & Neustadt

[57] ABSTRACT

A minimum pulse width switching power amplifier utilizes digital logic for generating a control pulse having a pulse width at least as large as a fixed minimum period of time when a base control pulse generated by a comparator has a pulse width at least as large as a given value. A high power switching output stage is switched between different voltage levels under control of the control signal generated by the digital logic so that an average actual output of the amplifier is equal to the desired output.

7 Claims, 3 Drawing Sheets

MINIMUM PULSE WIDTH SWITCHING POWER AMPLIFIER

BACKGROUND OF THE INVENTION

1. Field of the Invention

The present invention generally relates to a feedback controlled transconductance switching power amplifier particularly adapted for driving inductive loads, and more particularly, to a switching power amplifier for generating control pulses having a guaranteed minimum switching interval.

2. Discussion of the Background

Switching power amplifiers are distinguished from more conventional linear power amplifiers in that the output voltage, rather than being continuously variable over some wide range, is restricted to essentially two fixed levels. The purpose of this restriction is to minimize power losses in the output devices which are generally some kind of transistor device.

Linear amplifiers achieve a variable output voltage by controlling the resistance of the output transistors which are in series with a load between a fixed power supply and ground. Thus, at any output voltage intermediate between the power supply voltage and the ground, the output transistors must dissipate power resistively.

Switching power amplifiers avoid power dissipation by only operating the output transistors in a saturated "on" state having low resistance or in a "off" state having a very high resistance. Power dissipation in these amplifiers occurs primarily while the transistors are switching from one state to another, with some power being dissipated in the "on" state due to the non-zero on-resistance of the transistors. Because some of the power dissipation in these amplifiers occurs during the state transitions, it is clear that the efficiency relies on keeping the switching rate below some threshold which depends upon the switching characteristics of the output transistors.

The most widely used switching power amplifier is the pulse width modulated or PWM amplifier. This amplifier is a voltage-to-voltage amplifier, generally employing no feedback. It can be used to produce a transconductance amplifier if it is designed with a high gain and placed in a current comparative feedback loop.

The linearization scheme employed in PWM amplifiers is to rapidly switch the voltage applied to the load between two fixed levels, $V_1$ and $V_2$, in such a manner that the average voltage across the load is equal to a desired voltage. This is accomplished by comparing the input voltage to a high frequency triangle wave of fixed amplitude and frequency. As long as the reference triangle wave is smaller than the input voltage, the output devices are switched to apply $V_1$ to the load where $V_1$ is greater than $V_2$. When the reference triangle wave rises above the input voltage, the output devices are switched to apply voltage $V_2$ to the load.

A principal drawback of PWM amplifiers is their high complexity. In addition, when used in a current comparative feedback loop, the resulting system must be carefully compensated to ensure stability when driving inductive loads. This compensation tends to restrict the useable bandwidth of the overall amplifier.

A similar approach to building a switching transconductance amplifier for driving inductive loads is a "bang-bang" controlled system with a fixed sampling rate. This scheme involves driving the output amplifiers directly with the current comparator signal such that when the output current is larger than the requested current, the output transistors switch the output voltage to a "low" value and when the output current is less than the requested current, the output transistors switch the output voltage to a "high" value. In order to restrict the switching to a rate which provides high efficiency, a sample-and-hold device is inserted between the comparator and the output. This device is driven by a periodic clock. At the beginning of each clock period, the sample-and-hold device transfers the state of the comparator to the output devices. This state is then retained for the remainder of the clock period, and in this manner, the minimum switching rate is fixed by the clock.

Fixed sampling rate control can be implemented with a fairly simple circuit giving it a substantial advantage over PWM control. Its primary drawback is that this control scheme produces aliasing of signals having frequencies in excess of half the sampling frequency because the sampling times are fixed. This produces significant harmonic and crossover distortion.

Another approach which is similar to fixed sampling rate control is hysteretic control. Here, a small amount of hysteresis is added to the comparator so that rather than switching to a positive state precisely when the error between requested and actual currents becomes positive and switching to a negative state precisely when the error becomes negative, the positive transition is delayed until the error reaches some threshold value. When the amplifier is driving an inductive load, these voltage values yield a time delay due to the integrating effect of the load. Thus, a fixed period sample-and-hold device is apparently not required to control the minimum switching rate: the output of the comparator can drive the output devices directly with no intervening logic The circuit required to implement hysteretic control is even simpler than that required for fixed sampling rate control in that the arrangement dispenses with the clock and the sample-and-hold device at the expense of only a few resistors needed to produce the desired hysteresis. The absence of a fixed sampling rate results in an asynchronous configuration which greatly reduces harmonic and crossover distortion. The most apparent drawback to this design is that the switching rate will depend not only on the amount of hysteresis designed into the circuit, but also on the load impedance and the power supply voltages. Consequently, the amplifier must be tuned to the load in order to ensure that the switching rate does not exceed the maximum allowed for the output stage while remaining high enough to yield good bandwidth. A more insidious problem inherent in hysteretic control is that it can produce very short control pulses if the reference signal changes rapidly. This is a particular problem in the presence of noise in the reference signal. In the simple analysis, short control pulses will only seem to degrade the efficiency of the amplifier, but if the output is an H-bridge, short pulses may cause device failure.

Yet another approach is the pulse shaping configuration, wherein a pulse shaper is positioned between the comparator and output devices to guarantee a minimum switching interval, i.e., no short pulses. The disadvantages of this arrangement are that it exhibits moderately severe amplitude distortion and the output waveform always lags input reference in phase and magnitude. Further, stretching very short pulses to a given time interval causes deadband behavior in the output waveform.

Patents which disclose arrangements similar to those discussed above include U.S. Pat. Nos. 3,560,829, 4,779,183, 4,517,522, 4,288,738, 4,471,278, 3,745,477 and 4,636,711.

SUMMARY OF THE INVENTION

Accordingly, it is an object of the present invention to provide a minimum pulse width switching power amplifier having high efficiency, relative simplicity and good stability.

It is a further object of the present invention to provide a minimum pulse width switching power amplifier which eliminates short pulse fault susceptibility as experienced by prior designs.

Yet another object of the present invention is to provide a minimum pulse width switching power amplifier which guarantees a minimum switching interval.

Still another object of the present invention is to provide a minimum pulse width switching power amplifier in which the amplifier transfer function is independent of load inductance and resistance.

Yet a further object of the present invention is to provide a transconductance amplifier for driving inductive loads, for example, magnetic bearing coils.

The minimum pulse width switching power amplifier of the present invention is distinguished from a fixed sampling rate controller wherein switching can only occur at a clock edge, in that, with the amplifier of the present invention, the transition can occur anytime up to within a minimum pulse period of the last transition. Additionally, in a fixed sampling rate controller, the control pulse period must be an integer multiple of the clock; whereas, in the present invention, the amplifier permits control pulse periods to vary continuously from the fixed minimum period to infinity. Moreover, in the fixed sampling rate controller, control pulses generated by the comparator are always extended to the nearest integer multiple of the clock. However, in the present invention, the amplifier extends only those pulses which are between about one-half the fixed minimum pulse width and equal to this fixed minimum, whereas shorter pulses are discarded and longer pulses are not altered. Additionally, fixed rate sampling control does not explicitly introduce a time delay between the control pulse generated from the comparator and that delivered to the output device, but a time delay is implicit since this control scheme always extends the preceding pulse. However, in the present invention a fixed time delay is introduced which, according to one embodiment of the present invention, is equal to one-half the minimum pulse width.

Hysteretic control does not explicitly restrict the minimum pulse width seen by the output devices. However, this restriction is one of the motivating characteristics of the present invention. Additionally, the switching time in fixed sampling rate controllers is determined by a regular clock, i.e., a synchronous configuration; whereas in the present invention no clock is required and the device operates asynchronously.

These and other advantages, objects and features are achieved by a minimum pulse width switching power amplifier which, according to one embodiment of the present invention, comprises a comparator for comparing an actual output of the amplifier with a desired output to detect an error therebetween and for generating a base control signal at an output thereof. The output of the comparator switches state upon detection of a reversal in a sign of the error detected between the actual and desired outputs of the amplifier to generate the base control pulse having a given pulse width. Digital logic is provided for receiving the base control pulse generated by the comparator and for generating a control signal having a pulse width at least as large as a fixed minimum period of time when the base control pulse has a pulse width at least as large as a given value. Further, a high power switching output stage is provided for switching a voltage applied across a load of the power switching amplifier between different voltage levels under control of the control signal generated by the digital logic so that an average actual output of the amplifier is equal to the desired output.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
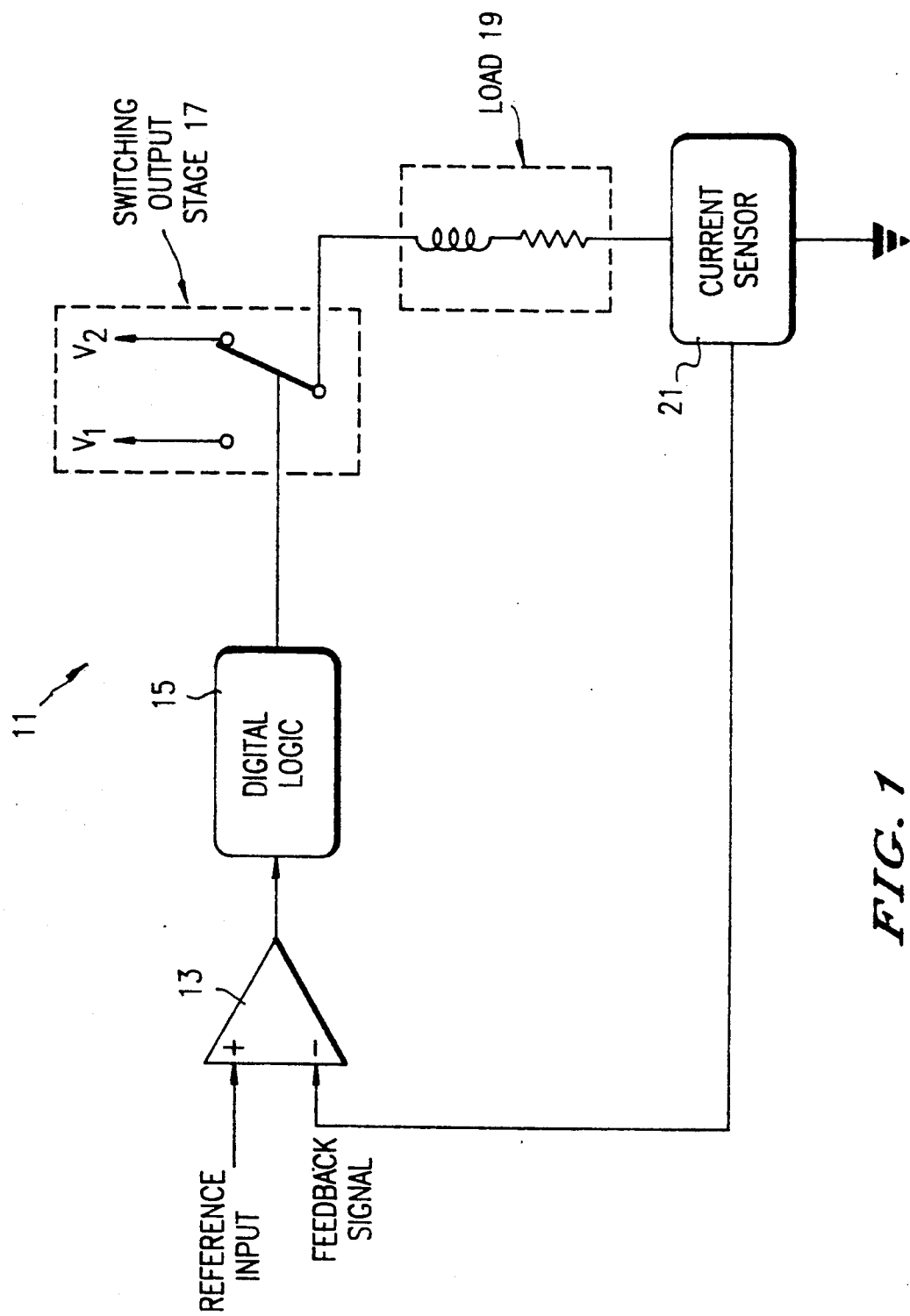
FIG. 1 schematically illustrates one embodiment of the minimum pulse width switching power amplifier according to the present invention.

Various other objects, features and attendant advantages of the present invention will be more fully appreciated as the same becomes better understood from the following detailed description when considered in connection with the accompanying drawings in which like reference characters designate like or corresponding parts throughout the several views.

Referring to FIG. 1, one embodiment of the minimum pulse width switching power amplifier is illustrated generally at 11. The power amplifier 11 includes a comparator 13 for comparing an actual output of the amplifier 11 with a desired output or ference value to detect an error therebetween. The comparator 13 generates a base controlsignal at its output, the output of the comparator 13 switching state upon detection of a reversal in the sign of the error detected between the actual and desired outputs of the amplifier to provide base control pulses having a given pulse width. The output of the comparator 13 is connected to digital logic 15 which receives the base control pulse generated by the comparator 13 and generates a control signal having a pulse width at least as large as a fixed minimum period of time when the base control pulse has a pulse width at least as large as a given value.

The control signal generated by the digital logic 15 controls a high power switching output stage 17 for switching a voltage applied across a load 19 of the switching power amplifier 11 between fixed voltage levels $V_1$, $V_2$, wherein $V_1$ is greater than $V_2$. Alternatively, an H-bridge or other bridge circuit can be employed to switch a voltage across the load.

An amplifier output sensor 21, for example, a current sensor, generates an output value indicative of the actual output of the amplifier which is applied as a feedback signal to the comparator 13 which compares this feedback signal with the desired or ference input value so that an average actual output of the amplifier 11 is equal to the desired output as indicated by the reference input signal.

Figure 2:
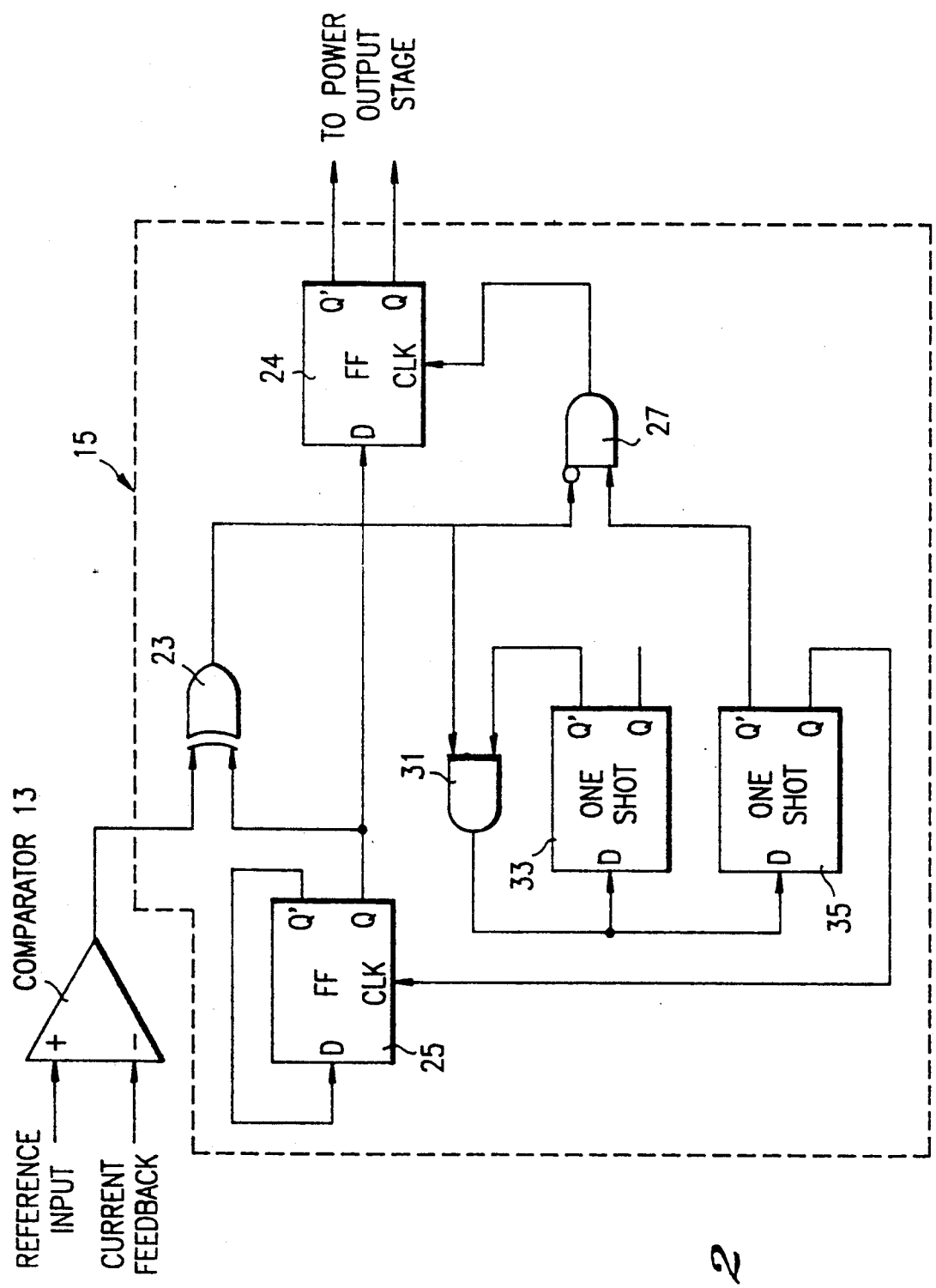
FIG. 2 illustrates one embodiment of the digital logic employed by the minimum pulse width switching power amplifier of the present invention.

Referring to FIG. 2, one embodiment of the digital logic 15 is illustrated and comprises an exclusive or (XOR) gate 23 having one input connected to the output of the comparator 13 and another input connected to a Q output of flip-flop 25, the Q' output of the flip-flop 25 being connected to its D input. The output of the XOR gate 23 is inverted and connected to an input of an AND gate 27 having its output connected to the clock (CLK) input of a flip-flop 29 which has its D input connected to the Q output of flip-flop 25 and its Q and Q' outputs respectively connected to the switching output stage 17.

The output of the XOR gate 23 is also connected to an input of AND gate 31 which has a further input connected to the Q' output of a one shot circuit 33 which upon receipt of a signal at its B input, outputs a pulse having a period of $\tau$. The output of the AND gate 31 is connected to the B input of the one shot circuit 33 and also to a B input of a further one shot circuit 35 having its Q' output connected to an input of AND gate 27 and its Q output connected to a clock (CLK) input of flip-flop 25, the one shot circuit 35 outputting a pulse having a period of $\alpha\tau$.

In operation, the circuit of FIG. 2 works in the following manner. When the output of the comparator 13 switches state, having detected a reversal in the sign of the error signal, XOR gate 23 indicates that a state change has been requested. If the comparator output does not agree with the output of flip-flop 25, then the output of XOR 23 will be high. If the Q' output of the one-shot circuit 33 is high, then this change of state of XOR gate 23 will generate a clock pulse acting both on the one-shot circuit 33 and the further one-shot circuit 35 and indirectly on flip-flop circuit 25.

Thus, if the Q' output of the one-shot circuit 33 is high, then the new comparator state will be clocked through flip-flop 25 and both of the one-shot circuits 33, 35 will be triggered causing their Q' outputs to go low. For a period of $\tau$ seconds the Q' output of the one-shot circuit 33 will remain low. Since the clock signal is generated by ANDing the Q' output of the one-shot circuit 33 and the output of XOR gate 23, subsequent changes at the comparator 33 will be ignored until the one-shot circuit 33 times out. In this manner, the output of the flip-flop 25 follows the output of the comparator 33 except when pulses shorter than $\tau$ are stretched to a period equaling $\tau$.

Each time a new state is clocked through flip-flop 25, the one-shot circuit 35 is triggered. The Q' output of this one-shot circuit 35 is ANDed with the inverted output of XOR gate 23 to yield a clock for flip-flop 29. If, at the end of a period of $\alpha\tau$, i.e., when the Q' output of one-shot circuit 35 goes high, XOR gate 23 is low indicating that the comparator output and the output of flip-flop 25 are in agreement, the output of flip-flop 25 will be clocked through to the output of flip-flop 29. This means that, if the output of the comparator 13 changes states within a period of $\alpha\tau$, then the pulse having a period less than $\alpha\tau$ will be ignored. Otherwise the pulse is transmitted to the switching output state 17, delayed by a period of $\alpha\tau$.

The objective in stripping off short pulses rather than extending them to the minimum pulse width is to eliminate a small signal deadband which results from always extending them. However, detecting short pulses requires a time delay. By setting this delay to be about one-half the minimum pulse width to thereby strip off pulses shorter than $\frac{1}{2}\tau$ and extending pulses between $\frac{1}{2}\tau$ and $\tau$, the average pulse width transmitted to the switching output stage 17 is equal to the average pulse width generated by the comparator. This choice of $\alpha = \frac{1}{2}$ eliminates the deadband and minimizes harmonic and crossover distortion.

Figure 3:
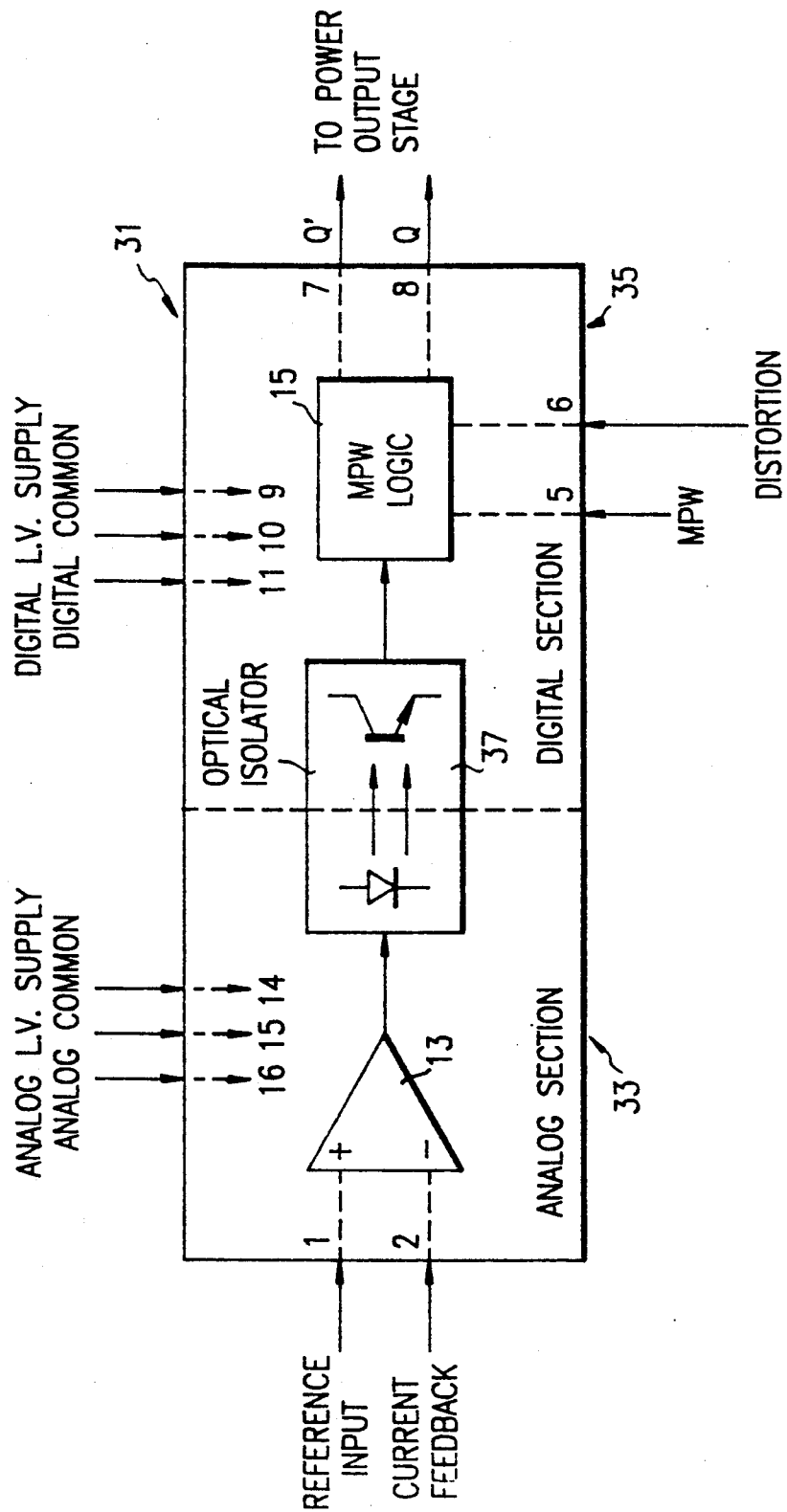
FIG. 3 illustrates a hybrid chip configuration for permitting construction of the minimum pulse width switching power amplifier of the present invention as a hybrid integrated circuit.

As can be seen from FIG. 2, the digital logic circuitry can be easily implemented with readily available standard logic devices. Thus, the core of the switching power amplifier 11, i.e., everything except the switching output stage 17, could, in a straightforward manner, be reduced to a single hybrid integrated circuit 31 as illustrated by FIG. 3. A low pin count of the hybrid integrated circuit 31 would allow the circuit to be housed in a standard 16-pin dual-inline-package with the middle pins of the package being removed to provide physical as well as logical separation between analog section 33 and digital section 35 of the circuit 31. Noise considerations dictate that the analog and digital sections 33, 35, including the commons or grounds, be kept separate and distinct throughout the entire system containing the amplifier thus, the use of an optical isolator 37 to connect these sections 33, 35 is preferred. Such a hybrid circuit construction would permit an inexpensive compact amplifier to be provided.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A minimum pulse width asynchronous switching power amplifier comprising:
   a comparator for comparing an actual output of the amplifier with a desired output to detect an error therebetween and for generating a base control signal at an output thereof, the output of the comparator switching state upon detection of a reversal in a sign of the error detected between the actual and desired outputs of the amplifier to provide a base control pulse with a given pulse width, a length of the given pulse width being determined by the length of time which transpires between successive reversals in sign of the error detected between the actual and desired outputs;
   digital logic for receiving the base control pulse generated by the comparator and for generating a control signal having a pulse width at least as large as a fixed minimum period of time when the base control pulse has a pulse width at least as large as a given value, wherein the digital logic includes means for stretching base control pulses having a pulse width at least as large as a given percentage of the fixed minimum period of time to a period of time equaling the fixed minimum and means for eliminating base control pulses having a pulse width less than the given percentage of the fixed minimum period of time; and a high power switching output stage for switching a voltage applied across a load of the switching power amplifier between different voltage levels under control of the control signal generated by the digital logic so that an average actual output of the amplifier is equal to the desired output;

wherein an average pulse width of the control signal transmitted to the power switching output stage by the digital logic means is equal to an average pulse width of the base control pulse generated by the comparator.

2. An amplifier according to claim 1, wherein the digital logic includes means for delaying the generation of the control pulse for a time interval equal to a given percentage of the fixed minimum period of time.

3. An amplifier according to claim 1, wherein the given percentage of the fixed minimum is about 50% of the fixed minimum period of time.

4. An amplifier according to claim 3, wherein the comparator is connected to the digital logic by an optical isolator.

5. An amplifier according to claim 4, wherein the amplifier is constructed as a hybrid integrated chip.

6. An amplifier according to claim 1, further comprising a current sensor for sensing an output current of the amplifier at the load, the output current sensed by the current sensor being employed to control the actual output of the amplifier compared by the comparator.

7. An amplifier according to claim 1, wherein the load is an inductive load.

* * * * *